United States Patent
Yeh et al.

(10) Patent No.: US 6,649,971 B1
(45) Date of Patent: Nov. 18, 2003

(54) NITRIDE READ-ONLY MEMORY CELL FOR IMPROVING SECOND-BIT EFFECT AND METHOD FOR MAKING THEREOF

(75) Inventors: Yen-Hung Yeh, Taoyuan Hsien (TW); Wen-Jer Tsai, Hualian (TW); Mu-Yi Liu, Taichung (TW); Kwang-Yang Chan, Hsinchu (TW); Tso-Hung Fan, Taipei (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,905

(22) Filed: Aug. 28, 2002

(51) Int. Cl.[7] ............................................. H01L 29/788
(52) U.S. Cl. ........................ 257/321; 257/391; 257/314
(58) Field of Search .................................. 257/391, 314, 257/321

(56) References Cited

U.S. PATENT DOCUMENTS

| | | | |
|---|---|---|---|
| 6,168,993 B1 * | 1/2001 | Foote et al. | 438/262 |
| 6,391,730 B1 * | 5/2002 | Kluth et al. | 438/302 |
| 6,538,270 B1 * | 3/2003 | Randolph et al. | 257/208 |
| 2001/0048612 A1 * | 12/2001 | Yi et al. | 365/185.17 |

* cited by examiner

Primary Examiner—Hoai Ho
Assistant Examiner—Tu-Tu Ho
(74) Attorney, Agent, or Firm—Jianq Chyun IP Office

(57) ABSTRACT

A NROM cell for reducing for reducing the second-bit effect is described. The NORM cell of the present invention is formed with a substrate, a silicon oxide/silicon nitride/silicon oxide (ONO) layer disposed on the substrate, a gate disposed on the silicon oxide/silicon nitride/silicon oxide layer, source/drain regions configured in the substrate beside the gate, and a shallow pocket doped region configured between the source/drain regions and the ONO layer beside the gate. The depth of the shallow pocket doped region is sufficiently small to prevent interference to the current flow that travels to the source/drain regions.

12 Claims, 3 Drawing Sheets

NITRIDE READ-ONLY MEMORY CELL FOR IMPROVING SECOND-BIT EFFECT AND METHOD FOR MAKING THEREOF

BACKGROUND OF INVENTION

1. Field of the Invention

The present invention relates to a nitride read only memory (NROM) cell. More particularly, the present invention relates to a NROM cell for reducing the second-bit effect.

2. Description of Related Art

The fabrication of a NROM cell includes forming a trapping layer on a substrate. The trapping layer is formed by providing an oxide/nitride/oxide (ONO) stacked layer structure with the silicon nitride layer serving as the trapping layer. The read only memory cell that uses this type of material as the electrons trapping layer is known as a nitride read only memory cell. A gate is further formed on the silicon oxide/silicon nitride/silicon oxide layer, followed by performing an ion implantation process on the substrate to form a source/drain region in the substrate adjacent to the gate structure.

For a nitride read only memory cell, a single NROM cell can store 1 bit each at the side of the source region and at the side of the drain region in the trapping layer. However, if one bit of data is already stored in the trapping layer at the side of the drain region, a second-bit effect is generated during the forward reading. In other words, the bit of information that is already stored in the trapping layer would affect the forward reading by raising the barrier substantially, resulting in an increase of the forward read threshold voltage. To resolve the aforementioned problems, increasing the drain voltage ($V_d$) and therefore increasing the drain-induced barrier lowering (DIBL) effect is traditionally used. However, as the scaling-down of the device dimension continues, a high drain voltage would lead to operational difficulties.

SUMMARY OF INVENTION

Accordingly, the present invention provides a NROM cell and a fabrication method thereof, wherein the second-bit effect is lower to prevent the increase of the DIBL effect. The reverse read threshold voltage is thereby increased.

The present invention provides a NROM cell for reducing the second-bit effect and a fabrication method thereof, wherein the DIBL effect is mitigated while the forward read is maintained.

In accordance to the present invention, a NROM cell for reducing the second bit effect is provided. The NORM cell of the present invention comprises a substrate, a silicon oxide/silicon nitride/silicon oxide (ONO) layer disposed on the substrate, a gate disposed on the silicon oxide/silicon nitride/silicon oxide layer, source/drain regions configured in the substrate beside the gate, and a shallow pocket doped region configured between the source/drain regions and the ONO layer beside the gate. Further, the depth of the shallow pocket doped region is sufficiently small to prevent interference to the current flow traveling to the source/drain regions.

The present invention provides a fabrication method for a nitride read-only memory cell for reducing the second-bit effect comprises forming a silicon oxide/silicon nitride/silicon oxide layer, followed by forming a gate on the silicon oxide/silicon nitride/silicon oxide layer. Thereafter, a shallow pocket ion implantation is performed on the substrate to form a shallow pocket doped region in the substrate beside the gate, wherein the depth of the shallow pocket doped region is sufficiently small to preclude interference to the forward read current flow. Ions are further implanted to the substrate at the peripheral of the shallow pocket doped region to form the source/drain regions.

The present invention provides a shallow doped region between the source/drain regions and the ONO layer beside the gate. Further, the depth of this shallow doped region is small enough to prevent interference to the forward read current flow. Therefore, an increase of the DIBL effect is prevented and the reverse read threshold voltage is increased. Further, since the depth of the pocket doped region is sufficiently small to prevent interference to the forward read current flow, the DIBL effect is mitigated while the forward read is maintained. Further, according to the present invention, the DIBL effect is attenuated without increasing the drain voltage.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
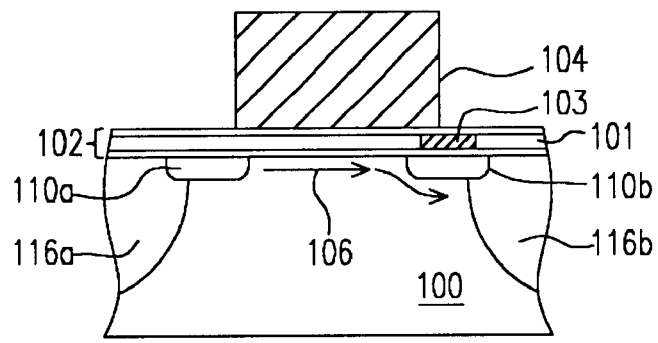
FIG. 1 is a schematic, cross-sectional view illustrating the NROM cell for reducing the second-bit effect according to one aspect of the present invention.

FIG. 1 is a schematic cross-sectional view illustrating the NROM cell for reducing the second-bit effect according to one aspect of the present invention.

Referring to FIG. 1, the NROM cell of the one aspect of the present invention comprises a substrate 100 and a silicon oxide/silicon nitride/silicon oxide (ONO) layer 102 disposed on the substrate 100. A gate 104 is disposed on the silicon oxide/silicon nitride/silicon oxide layer 102, while the source/drain regions 116a, 116b are configured in the substrate 100 beside the gate 104. Shallow pocket doped regions 110a, 110b are configured between the source/drain regions 116a, 116b and the ONO layer 102 beside the gate 104, wherein the depth of the shallow pocket doped regions 110a, 110b is less than 400 angstroms, and is preferably less than 200 angstroms. The width of the shallow pocket doped regions 110a, 110b is about 500 angstroms. As a nitride silicon read only memory cell is performing a forward read, the current flow of the forward read would follow the current path 106 as shown in FIG. 1. When charges are already present in the trapping layer at the side of the drain region, the current path would deviate from the original current path along the channel between the source region and the drain region to a certain depth further inside the substrate 100 as the current approaches the drain region 116b. Therefore, the depths for the shallow pocket doped regions 110a, 110b of the nitride read only memory cell of the present invention need to be sufficiently small to prevent interference to the current flow that travels to the source/drain regions 16a, 116b during the forward read, while maintaining the threshold voltage (Vt) during the forward read.

Figure 2:
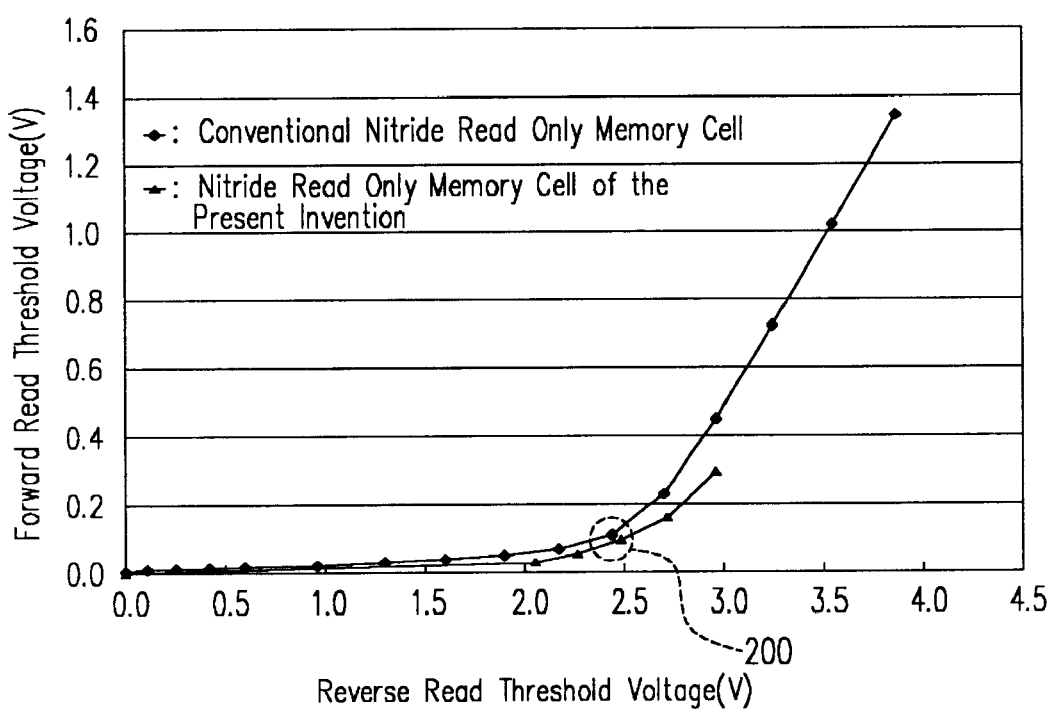
FIG. 2 illustrates the relationships between the threshold voltages of a forward read operation and a reverse read operation for a NROM cell of the present invention and a conventional NROM cell, respectively.

Still referring to FIG. 1, if one bit of data is already stored in the trapping region 103 in the silicon nitride layer 101 of the silicon oxide/silicon nitride/silicon oxide layer 102 above the drain region 116b, the second-bit effect is reduced to its minimum during the reverse read due to the presence of the shallow pocket doped region 110b. In other words, an increase of the drain-induced barrier lowering (DIBL) due to the lowering the barrier is prevented. The threshold voltage (Vt) of the forward read is thereby increased. Referring to FIG. 2, FIG. 2 illustrates the differences between the present invention and the prior art.

FIG. 2 illustrates the relationships between the threshold voltages of a forward read operation and a reverse read operation for a NROM of the present invention and a conventional NROM, respectively.

Referring to FIG. 2, FIG. 2 illustrates the relationships between the threshold voltages of a reverse read and a forward read for a NROM cell of the present invention and a conventional NROM cell when the line width is 0.3 microns and the drain voltage is at 1.6 volts. At the position 200 on the curves in FIG. 2, when the reverse read threshold voltage exceeds 2.5 volts and the forward read threshold voltage exceeds 0.1 volts, the reverse read threshold voltage of the NROM cell of the present invention is significantly higher than the reverse read threshold voltage of a conventional NROM under a same forward read threshold voltage. Therefore, the present invention can prevent an increase of the DIBL effect to increase the forward read threshold voltage (Vt). The method for fabricating a nitride read-only memory cell according to the present invention is illustrated from FIGS. 3A to 3C.

Figure 3A:
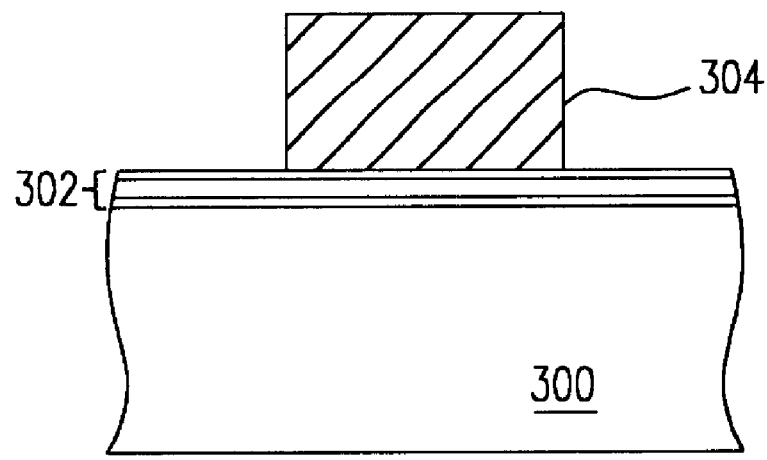
FIGS. 3A to 3C are schematic, cross-sectional views illustrating the process flow for manufacturing a nitride read only memory cell for reducing the second-bit effect according to one aspect of the present invention.
Figure 3B:
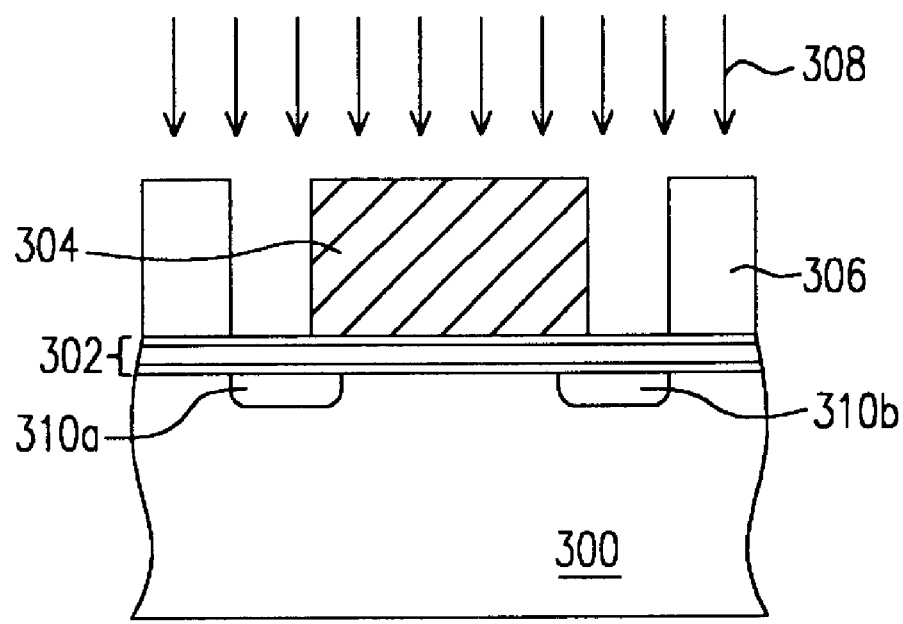
Figure 3C:
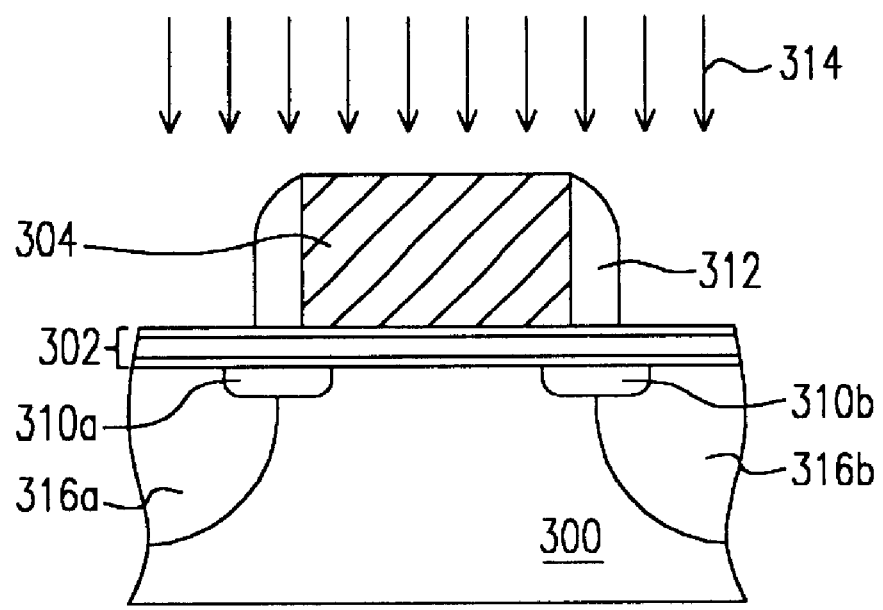

FIGS. 3A to 3C are schematic cross-sectional views illustrating the process flow for manufacturing a nitride read only memory cell for reducing the second-bit effect according to one aspect of the present invention.

Referring to FIG. 3A, a silicon oxide-silicon nitride-silicon oxide (ONO) stacked layer 302 is formed on a substrate 300. The ONO stacked layer 302 is formed with a bottom oxide layer, a silicon nitride layer and a top oxide layer. Thereafter, a conductive layer is formed on the silicon oxide/silicon nitride/silicon oxide stacked layer 302 as a gate 304 for the nitride read only memory cell. A material for the conductive layer is, for example, a polysilicon layer.

Continuing to FIG. 3B, a mask layer 306 is formed as a photoresist on the silicon oxide/silicon nitride/silicon oxide layer 302, wherein substrate 300 adjacent to the gate 304 is exposed. Thereafter, a shallow pocket ion implantation 308 is performed to form shallow pocket doped regions 310a, 310b are the substrate 300, wherein the depths of the pocket doped regions 310a, 310b is less than 400 angstroms, preferably less than 200 angstroms. The dopant concentration for the shallow pocket implantation 308 is about, $1.5\times10^{18}/cm^{-3}$. Further, even a mask 306 is not formed on the substrate 300, the gate 304 can serve as an implantation mask while the shallow pocket implantation process 308 is performed.

Referring to FIG. 3C, the mask 306 (as shown in FIG. 3B) is removed, and a spacer 312 is formed on the sidewalls of the gate 304. Thereafter, an ion implantation process 314 is performed on the substrate 300 to form the source/drain regions 316a, 316b in the substrate 300 beside the gate 304.

In accordance with the present invention, the present invention provides a shallow pocket doped region between the source/drain regions and the silicon oxide/silicon nitride/silicon oxide layer beside the gate to prevent an increase of the DIBL effect and to thereby increase the reverse read threshold voltage.

In accordance with the present invention, the DIBL effect is substantially attenuated without increasing the drain voltage.

The depth of the shallow doped region provided by the present invention precludes any interference to the forward read current. The DIBL effect can thus be reduced while the forward read is maintained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A nitride read only memory cell for reducing a second-bit effect, comprising:

a substrate;

a silicon oxide/silicon nitride/silicon oxide layer, disposed on the substrate;

a gate, disposed on the silicon oxide/silicon nitride/silicon oxide layer;

a source/drain region, configured in the substrate beside the gate; and a shallow pocket doped region, configured between the source/drain region and the silicon oxide/silicon nitride/silicon oxide layer beside the gate, wherein a depth of the shallow doped region is less than about 400 angstroms, which is small enough to prevent an interference to a current flow traveling to the source/drain region.

2. The memory cell of claim 1, wherein the gate is made with a material including polysilicon.

3. The memory cell of claim 1, wherein the depth of the shallow pocket doped region is less than 200 angstroms.

4. A fabrication method for a nitride read only memory cell for reducing a second-bit effect, comprising:

providing a substrate;

forming a silicon oxide/silicon nitride/silicon oxide layer on the substrate;

forming a gate on the silicon oxide/silicon nitride/silicon oxide layer;

forming a mask over the silicon oxide/silicon nitride/silicon oxide layer, wherein the mask exposes a region beside the gate;

performing a shallow pocket implanting process to form a shallow doped region in the substrate beside the gate, wherein the shallow pocket doped region in the substrate comprises a first depth of less than 400 angstroms;

removing the mask; and forming a source/drain region in the substrate beside the gate, wherein a minimum depth of a current path for a current flow to the source/drain region during a forward read is a second depth, wherein the second depth is greater than the first depth.

5. The method of claim 4, wherein the first depth is less than 200 angstroms.

6. The method of claim 4, wherein the gate is formed with a material including polysilicon.

7. The method of claim 4, wherein forming the mask layer includes forming a photoresist.

8. The method of claim 4, wherein forming the source/drain region in the substrate beside the gate comprises:

forming a spacer on sidewalls of the gate; and performing an ion implantation to the substrate to form the source/drain region in the substrate beside the gate.

9. A method for fabricating a nitride read-only memory cell for reducing the second-bit effect, comprising:

providing a substrate;

forming a silicon oxide/silicon nitride/silicon oxide layer on the substrate;

forming a gate on the silicon oxide/silicon nitride/silicon oxide layer;

performing a shallow pocket implantation to form a shallow pocket doped region with a depth of less than 400 angstroms in the substrate, wherein the depth is shallower than a shallowest current path under the shallow doped region during a forward read; and forming a source/drain region in the substrate.

10. The method of claim 9, wherein the depth of the shallow pocket doped region is less than 200 angstroms.

11. The method of claim 9, wherein the gate is formed with a material including polysilicon.

12. The method of claim 9, wherein forming the source/drain region in the substrate beside the gate comprises:

forming a spacer on a sidewall of the gate, and performing an ion implantation to the substrate to form the source/drain region in the substrate beside the gate.

* * * * *